United States Patent [19]
Farazi et al.

[11] 4,428,224
[45] Jan. 31, 1984

[54] APPARATUS AND METHOD FOR TESTING OF A ROTARY MOVEMENT-ELECTRICAL SIGNAL TRANSDUCER SYSTEM

[75] Inventors: Perry Farazi, Chicago; Howard L. Frank, Skokie, both of Ill.

[73] Assignee: Sun Electric Corporation, Crystal Lake, Ill.

[21] Appl. No.: 168,781

[22] Filed: Jul. 14, 1980

Related U.S. Application Data

[63] Continuation of Ser. No. 23,462, Mar. 23, 1979, abandoned.

[51] Int. Cl.³ .............................................. G01P 21/00
[52] U.S. Cl. ....................................................... 73/2

[58] Field of Search ..................... 73/1 R, 1 D, 2, 121; 303/92; 324/186

[56] References Cited

U.S. PATENT DOCUMENTS 4,082,370  4/1978  Leiber et al. ........................... 303/92
4,092,853  6/1978  Schneider ............................... 73/121
4,106,820  8/1978  Ruhnau et al. ......................... 303/92

Primary Examiner—S. Clement Swisher
Attorney, Agent, or Firm—Allegretti, Newitt, Witcoff & McAndrews, Ltd.

[57] ABSTRACT

An apparatus and method for dynamic testing of a rotary movement-electrical signal transducer system, such as found in an automotive anti-blocking system.

5 Claims, 1 Drawing Figure

APPARATUS AND METHOD FOR TESTING OF A ROTARY MOVEMENT-ELECTRICAL SIGNAL TRANSDUCER SYSTEM

CROSS-REFERENCE TO RELATED APPLICATIONS

This is a continuation of application Ser. No. 023,462, filed Mar. 23, 1979, now abandoned.

BACKGROUND OF THE INVENTION

This invention relates to testing of a rotary movement-electrical signal transducer system, and more particularly, to apparatus and a method for dynamic testing of a rotary movement-electrical signal transducer system.

Automobiles are currently being produced with anti-block or anti-skid systems to control skidding. Such an anti-block system typically includes a rotary movement-electrical signal transducer subsystem associated with each wheel of the automobile, a computer controller, and an electrical signal-brake pressure transducer subsystem associated with each brake of the automobile. Each rotary movement-electrical signal transducer subsystem supplies an electrical signal which is in pulses frequency-related to the rotary movement of a wheel. These signals are read and interpreted by the computer controller, which, when a skid is indicated during braking of the automobile, signals the electrical signal-brake pressure transducer subsystems to reduce braking of the skidding wheels and thereby counteract the skid.

In at least one such system, the rotary movement-electrical signal subsystem includes a toothed ferromagnetic wheel co-axially mounted with the wheel of the automobile. A magnetic-electric transducer or sensor is fixedly mounted adjacent the ferromagnetic wheel, where the teeth and interposing gaps of the ferromagnetic wheel co-operate with the sensor to generate a sinusoidal electrical signal. The frequency of the signal is proportional to the rotational velocity of the ferromagnetic wheel and thus the rotational velocity of the automobile wheel.

A problem associated with a rotary movement-electrical signal transducer subsystem or system as described is accurate testing of the system. Erroneous electrical signals may be caused by many component failures, including teeth missing from the toothed wheel. Since the toothed wheel and sensor are typically located within a sealed chamber behind the vehicle wheel, remote electronic testing on the subsystem is desirable. U.S. Pat. No. 4,092,853 discloses a basic test system and method, but this system and method fail to indicate the absence of teeth unless three adjacent teeth are missing.

SUMMARY OF THE INVENTION

In a principal aspect, the present invention is a method of dynamically testing a rotary movement-electrical signal transducer system providing a fixed number of pulses for each revolution of rotary movement when non-defective.

First the time periods of the fixed number of successive pulses are measured to form measured periods. The average period is then calculated and the minimum period and maximum period formed by comparison of the measured periods.

The minimum period is then compared with the average period to form a first evaluation interval, and the maximum period compared the average period to form a second evaluation interval.

The first evaluation interval is compared with the reference interval; if the first evaluation interval exceeds the reference interval, the positive test signal is inhibited.

The second evaluation interval is compared with the reference interval, and the positive test signal is inhibited if the second evaluation interval exceeds the reference interval.

Finally, the positive test signal is transmitted if the reference interval exceeds the first evaluation interval and if the reference interval exceeds the second evaluation interval.

In a second principal aspect, the present invention is an apparatus for performing the method of testing.

It is thus an object to provide an apparatus and method for dynamic testing of a rotary movement-electrical signal transducer system, such as found in an automotive blocking system.

Another object is to provide an apparatus and method capable of indicating the absence of a single tooth from the toothed wheel of a rotary movement-electrical signal transducer.

DETAILED DESCRIPTION OF THE PREFERRED EMBODIMENT

Figure 1:
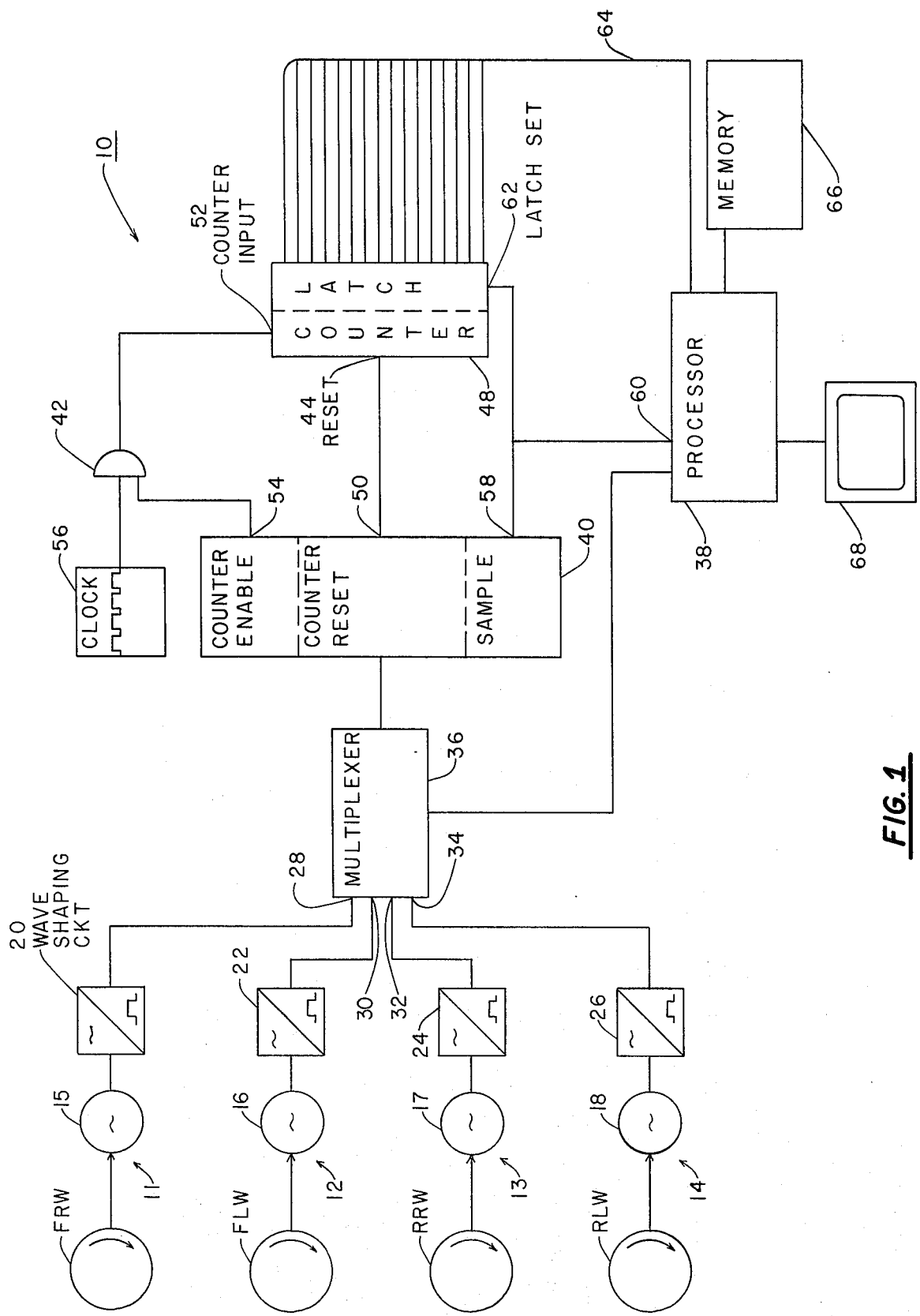
FIG. 1 of the accompanying drawing is a schematic diagram of the preferred apparatus of the present invention.

Referring to FIG. 1, the preferred embodiment of the present invention is an apparatus generally designated 10 for testing rotary movement-electrical signal transducers 11, 12, 13, 14.

As depicted, the transducers 11, 12, 13, 14 are part of an anti-block system of a four-wheeled automobile. The transducers 11, 12, 13, 14 include tachometer-generators 15, 16, 17, 18, respectively. Each tachometer-generator 15, 16, 17, 18 is associated with a wheel of the automobile and generates a sinusoidal signal having a frequency in proportion to the rotational wheel of its associated wheel. Tachometer-generator 15 is associated with the front right wheel FRW; tachometer-generator 16 is associated with front left wheel FLW; tachometer-generator 17 is associated with rear right wheel RRW; and tachometer-generator 18 is associated with rear left wheel RLW.

The apparatus 10 includes wave-shaping stages 20, 22, 24, 26 connected to tachometer-generators 15, 16, 17, 18, respectively. The wave-shaping stages 20, 22, 24, 26 convert the sinusoidal electrical signals of the tachometer-generators 15, 16, 17, 18 to square waves of equivalent periods.

The square-wave outputs of the wave-shaping stages 20, 22, 24, 26 are connected to the inputs 28, 30, 32, 34 of a multiplexer 36. The output signal of the multiplexer 36 is equivalent to the output of a signal of a wave shaping stage 20, 22, 24 or 26, as controlled by a processor 38.

The processor 38 samples the multiplexer inputs 28, 30, 32, 34 and recognizes the presence or absence of a signal from a wave-shaping stage 20, 22, 24, 26.

If and when a signal is present at an input 28, 30, 32 or 34, the processor 38 selects that input and commands the multiplexer to output only the signal there present.

So long as a signal remains at the selected input, the command is maintained. When a signal ceases, the processor 38 returns to sampling.

The output of the multiplexer 36 is connected to the input of controller 40. The controller 40 is also connected to a gate 42 and the reset input 44 of a 16 bit counterlatch 48. The controller 40 is responsive to the rising flank of the first pulse from the multiplexer 36 and to the rising flank of each succeeding pulse. The controller 40 responds particularly to the first pulse by transmitting a "reset" output signal via output 50 to the counter reset 44 and an "enable" output signal via output 54 to the gate 42 to initialize the counter to begin a count. The gate 42 connects a clock 56 and a counter input 52. When the output signal from output 54 is received, the gate 42 connects the clock 46 to the counter input 52. The counter 48 thus counts pulses from the clock 56, beginning from zero.

The controller 40 responds to the rising flank of the first and to each succeeding pulse by transmitting a "sample" signal via output 58 to the processor input 60. The signal at latch set 62 sets the latch at the current count. The signal at the processor input 60 activates the processor 38 to read the latch via data bus 64. The processor 38 stores the latch data or count in a memory 66.

The apparatus 10 thus measures and stores raw data as to the time periods of pulses from a rotary movement-electrical signal transducer. The processor 38 compares pairs of succeeding counts and calculates the difference in counts to establish the time periods of pulses in clock pulses.

For display purposes, the frequency of the clock 56 is stored in memory 66. As most preferred, the frequency is 2 MHz. The processor 38 converts the time periods of pulses as measured in clock pulses to seconds or any other desired unit of time. The current time period is displayed on a video display 68.

The processor 38 compares the time periods of the pulses as calculated to form a maximum time period and a minimum time period. The processor also calculates the average time period. The number of time periods utilized for forming the maximum and minimum time periods and calculating the average time period equals the fixed number of pulses generated by a tachometer-generator 15, 16, 17 or 18 on one rotation of a wheel FRW, FLW, RRW or RLW, when the tachometer-generator 15, 16, 17 or 18 is non-defective. As most preferred, the apparatus 10 measures the time periods of an additional four pulses and the processor 38 eliminates the first and last two measurements. As an example, if the tachometer-generator is of the toothed wheel-magnetic sensor type, and if the toothed wheel has ninety-six teeth, the apparatus 10 measures the time periods of one hundred pulses and selects the middle ninety-six for further processing.

The processor 38 compares the minimum period to the average period to form a first evaluation interval, and compares the maximum period to the average period to form a second evaluation interval. The processor 38 tests these evaluation intervals to assure substantial uniformity of the measured time periods. Non-uniformity reveals a defective rotary movement-electrical signal transducer, and prevents the indication of a satisfactory test.

To test the evaluation intervals, the processor 38 generates a reference interval. The evaluation intervals are individually compared with the reference interval. The processor 38 generates a satisfactory or positive test signal to the display 68. If the first evaluation interval exceeds the reference interval, or if the second evaluation interval exceeds the reference interval, the processor inhibits the positive test signal. If the reference interval exceeds both the first evaluation interval and the second evaluation interval, the positive test signal is transmitted to the display 68.

A person testing the rotary movement-electrical signal transducers 11, 12, 13, 14 of an automobile proceeds as follows. The automobile is lifted so that the wheels may rotate freely. The apparatus 10 is then connected to the signal lines of the transducers 11, 12, 13, 14. The operator then selects, at random, the first transducer to be tested, by selecting its wheel for rotation. Rotation of the wheel causes the apparatus 10 to begin measuring the time periods of the electrical pulses of the transducer. The apparatus 10 continuously displays periods of the pulses being measured. As soon as the necessary number of pulses have been measured, the processor 10 tests the measured time periods. Display of the positive test signal alerts the operator to proceed to a second wheel. The absence of a positive test signal alerts the operator to continue rotating the first wheel, and the apparatus 10 continues to measure and evaluate pulse time periods. If the first wheel has been rotated for more than several revolutions and a positive test signal is not displayed, the operator recognizes the absence of the positive test signal as an indication of a potentially defective transducer.

What is claimed is:

1. A method for testing a rotary movement-electrical signal transducer system of the type generating a series of signals during operation thereof, comprising the steps of:
   receiving said signals;
   measuring the time of each of said signals to establish the periods therefor;
   comparing said periods to determine a maximum period and a minimum period thereof;
   determining an average period for said periods;
   comparing said average period to said minimum period and said maximum period to provide a first evaluation interval and a second evaluation interval, respectively;
   generating a reference interval;
   comparing said reference interval to said first evaluation interval and said second evaluation interval; and
   generating a postive test signal whenever said first evaluation interval and said second evaluation interval are less than said reference interval.

2. An apparatus for testing a rotary movement-electrical signal transducer system, said system providing a series of pulses during operation thereof, comprising:
   input means coupled to said system for receiving said pulses;
   means for measuring the time of each of said pulses to establish a series of periods relted to said pulses;
   processor means for receiving said series of periods and for determining therefrom a miximum, minimum and average of said periods, said processor means calculating a first evaluation interval from said minimum and said average and a second evaluation interval from said maximum and said average;
   said processor means further generating a reference interval and comparing said first evaluation interval and said second evaluation interval thereto, said processor means transmitting a positive test signal whenever said first evaluation interval and said second evaluation interval are less than said reference interval; and output means for displaying said positive test signal.

3. An apparatus as claimed in claim 2 wherein said input means includes a wave shaping circuit to produce a square wave in response to said pulses.

4. An apparatus as claimed in claim 2 wherein said means for measuring includes a controller, a clock and a counter, said controller being coupled and responsive to said input means, said clock and said counter being coupled and responsive to said controller.

5. An apparatus as claimed in claim 4 wherein said processor means is coupled to said controller and said counter.

* * * * *